United States Patent
Huitink et al.

(10) Patent No.: US 11,071,234 B2
(45) Date of Patent: Jul. 20, 2021

(54) HELICAL FIN DESIGN BY ADDITIVE MANUFACTURING OF METAL FOR ENHANCED HEAT SINK FOR ELECTRONICS COOLING

(71) Applicant: BOARD OF TRUSTEES OF THE UNIVERSITY OF ARKANSAS, Fayetteville, AR (US)

(72) Inventors: David Huitink, Prairie Grove, AR (US); Bakhtiyar Mohammad Nafis, Fayetteville, AR (US); Reece Whitt, Corsicana, TX (US)

(73) Assignee: Board Of Trastees Of The University Of Arkansas, Fayetteville, AR (US)

( * ) Notice: Subject to any disclaimer, the term of this patent is extended or adjusted under 35 U.S.C. 154(b) by 0 days.

(21) Appl. No.: 16/667,720

(22) Filed: Oct. 29, 2019

(65) Prior Publication Data
US 2020/0137921 A1    Apr. 30, 2020

Related U.S. Application Data

(60) Provisional application No. 62/752,821, filed on Oct. 30, 2018.

(51) Int. Cl.
| | | |
|---|---|---|
| *H05K 7/20* | (2006.01) |
| *F28F 13/06* | (2006.01) |
| *F28F 3/02* | (2006.01) |
| *F28F 13/00* | (2006.01) |

(52) U.S. Cl.
CPC ............. *H05K 7/2039* (2013.01); *F28F 3/02* (2013.01); *F28F 3/022* (2013.01); *F28F 13/00* (2013.01); *F28F 13/06* (2013.01)

(58) Field of Classification Search
CPC . H01L 23/467; H01L 23/3672; H01L 23/367; G06F 1/203; F21V 29/74; F21V 29/763; H02K 5/18; F28D 2021/0029; F28F 3/02; F28F 13/00; F28F 13/06; F28F 3/022; H05K 7/20154; H05K 7/2039; H05K 1/0203; H05K 2201/066
See application file for complete search history.

(56) References Cited

U.S. PATENT DOCUMENTS

| | | | | |
|---|---|---|---|---|
| 4,222,160 A | * | 9/1980 | Kerivan | B21C 37/22 165/183 |
| 4,798,241 A | * | 1/1989 | Jarrett | B01F 5/0614 138/38 |
| 5,000,254 A | * | 3/1991 | Williams | F28F 13/02 165/109.1 |

(Continued)

OTHER PUBLICATIONS

Ventola, L., Robotti, F., Dialameh, M., Calignano, F., Manfredi, D., Chiavazzo, E., & Asinari, P. (2014). Rough surfaces with enhanced heat transfer for electronics cooling by direct metal laser sintering. International Journal of Heat and Mass Transfer, 75, 58-74.

(Continued)

*Primary Examiner* — Adam B Dravininkas
(74) *Attorney, Agent, or Firm* — Keith A. Vogt; Keith Vogt Ltd.

(57) ABSTRACT

A heat sink and method of making the same. The heat sink having one or more helical fins. The helical fins configured such that the pressure field on either side of the fin is asymmetric.

8 Claims, 7 Drawing Sheets

(56) References Cited

U.S. PATENT DOCUMENTS

| | | | | | |
|---|---|---|---|---|---|
| 5,299,090 | A | * | 3/1994 | Brady | H01L 23/3677 361/703 |
| 5,661,638 | A | * | 8/1997 | Mira | H01L 23/467 165/126 |
| 6,003,586 | A | * | 12/1999 | Beane | B22D 18/06 164/63 |
| 6,025,643 | A | * | 2/2000 | Auger | H01L 23/3677 257/667 |
| 6,053,240 | A | * | 4/2000 | Johnston | H01L 23/367 165/185 |
| 6,575,231 | B1 | * | 6/2003 | Wu | H01L 23/467 165/121 |
| 6,807,059 | B1 | * | 10/2004 | Dale | H01L 21/4882 165/185 |
| 2002/0053422 | A1 | * | 5/2002 | Juslenius | F28F 1/122 165/133 |
| 2003/0150596 | A1 | * | 8/2003 | Chen | H01L 23/467 165/80.3 |
| 2007/0131386 | A1 | * | 6/2007 | Tsai | H01L 23/3677 165/80.3 |
| 2008/0066888 | A1 | * | 3/2008 | Tong | H01L 23/3677 165/80.3 |
| 2009/0145581 | A1 | * | 6/2009 | Hoffman | H01L 23/473 165/80.3 |
| 2011/0079376 | A1 | * | 4/2011 | Loong | H01L 23/473 165/185 |
| 2016/0178287 | A1 | * | 6/2016 | Karlen | F28F 13/12 165/181 |

OTHER PUBLICATIONS

Wong, K. K., Ho, J. Y., Leong, K C., & Wong, T. N. (2016). Fabrication of heat sinks by selective laser melting for convective heat transfer applications. Virtual and Physical Prototyping, 11(3), 159-165.

Wong, M., Owen, I., Sutcliffe, C. J., & Puri, A. (2009). Convective heat transfer and pressure losses across novel heat sinks fabricated by Selective Laser Melting. International Journal of Heat and Mass Transfer, 52(1-2), 281-288.

* cited by examiner

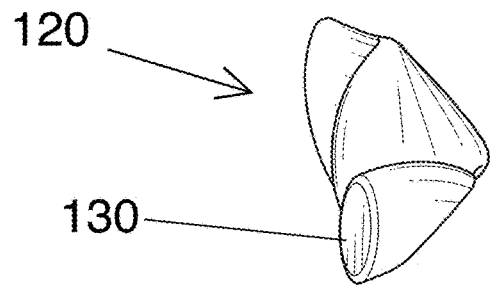
FIG. 1C
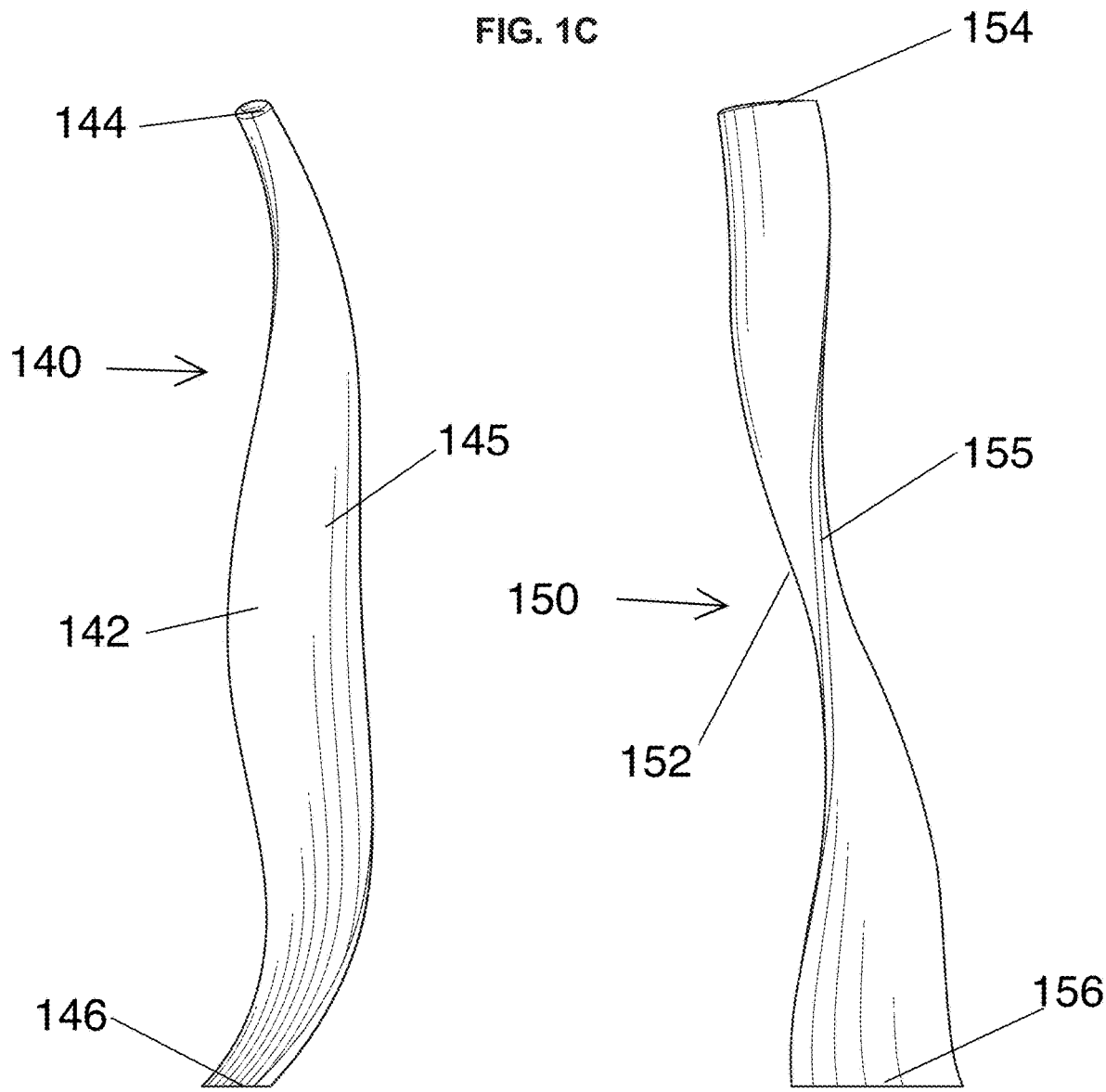
FIG. 1D
FIG. 1E

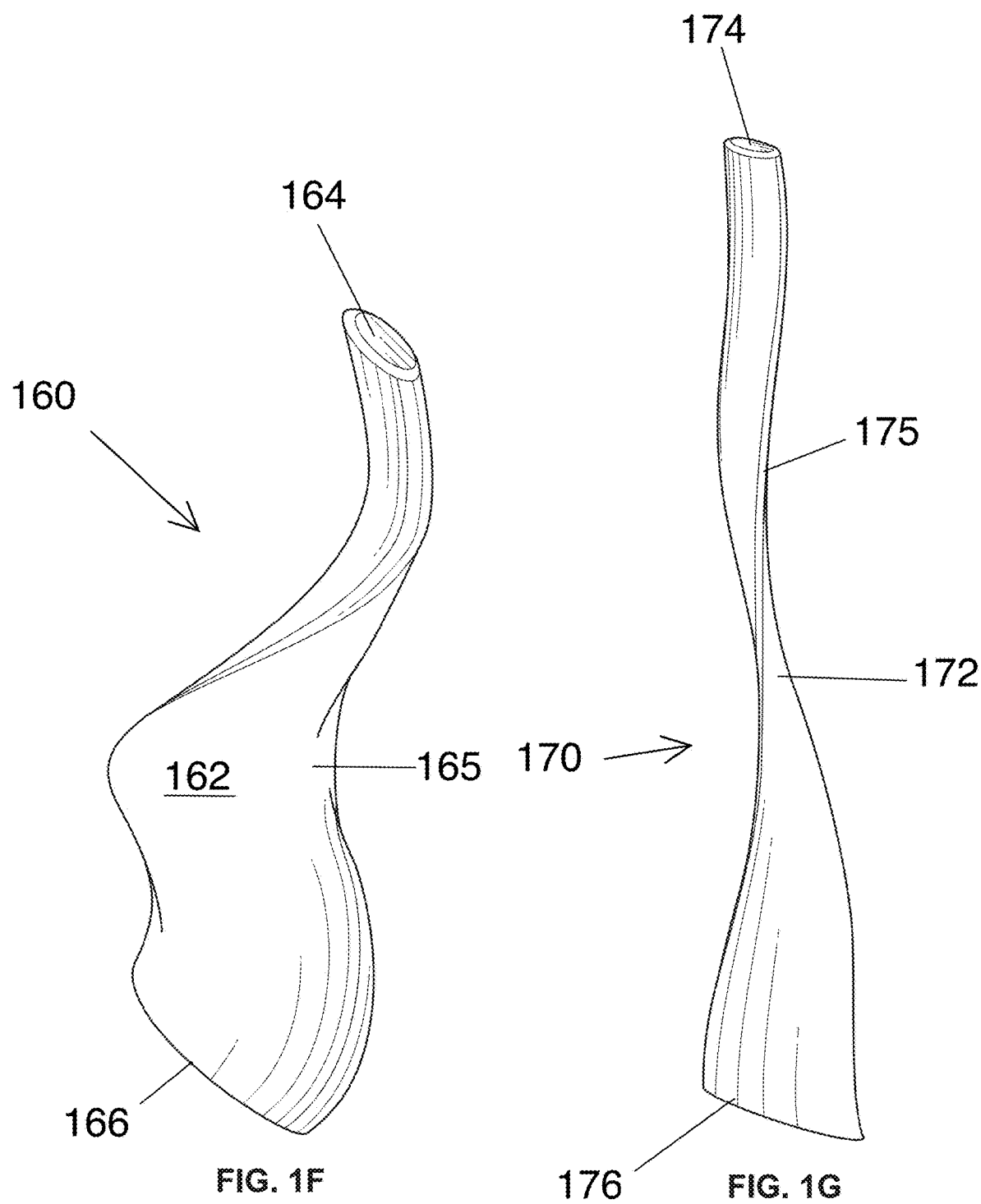

# US 11,071,234 B2

HELICAL FIN DESIGN BY ADDITIVE MANUFACTURING OF METAL FOR ENHANCED HEAT SINK FOR ELECTRONICS COOLING

RELATED APPLICATIONS

This application claims priority to U.S. Provisional Application Ser. No. 62/752,821 filed Oct. 30, 2018, which is incorporated herein in its entirety.

STATEMENT REGARDING FEDERALLY SPONSORED RESEARCH & DEVELOPMENT

Not applicable.

INCORPORATION BY REFERENCE OF MATERIAL SUBMITTED ON A COMPACT DISC

Not applicable.

BACKGROUND OF THE INVENTION

Heat sinks are typically used for cooling electronics and any thermal/fluid system in which there is a need to dissipate losses in the form of heat. Heat sinks are often manufactured using conventional manufacturing techniques.

BRIEF SUMMARY OF THE INVENTION

In one embodiment, the present invention provides an additively manufactured heat sink that is able to provide significantly better cooling than its conventional counterparts, while also resulting in more uniform cooling across the area regardless of flow direction.

In other embodiments, the present invention provides a heat sink with an improved heat rejection for similar fan flow rate, or alternatively, reduced fan power for similar heat rejection from heated elements.

In other embodiments, the present invention provides a heat sink that can be customized to the heat source since additive manufacturing opens up customizable designs.

In other embodiments, the present invention provides a heat sink that is optimized for additive manufacturing.

In other embodiments, the present invention provides a heat sink that instead of using conventional manufacturing techniques, 3D printing allows for more unique and effective designs to be implemented.

In other embodiments, the present invention provides a heat sink that may be designed for use in any thermal/fluid system in which a heat sink is utilized to dissipate losses in the form of heat.

In other embodiments, the present invention provides a heat sink that uses a helical fin design that may be created using 3D manufacturing to produce a heat sink that allows for more efficient cooling of electronic devices through increased mixing throughout the system.

In other embodiments, the present invention provides a fin that is shaped to create vortices and disrupts the flow field allowing for more effective heat transfer resulting in the lowering of the maximum temperature of the heat sink.

In other embodiments, the present invention provides a fin that is shaped to promote warm fluid to come into contact with cooler areas and to recirculate throughout the system to further cool the fins.

In other embodiments, the present invention provides one or more fins that are metallic or non-metallic or combinations thereof.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

FIG. 1C shows a first helical fin that may be used with an embodiment of the present invention.

FIG. 1D shows a second helical fin that may be used with an embodiment of the present invention.

FIG. 1E shows a third helical fin that may be used with an embodiment of the present invention.

FIG. 1F shows a fourth helical fin that may be used with an embodiment of the present invention.

FIG. 1G shows a fifth helical fin that may be used with an embodiment of the present invention.

DETAILED DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure or system. Further, the terms and phrases used herein are not intended to be limiting, but rather to provide an understandable description of the invention.

Figure 1A:
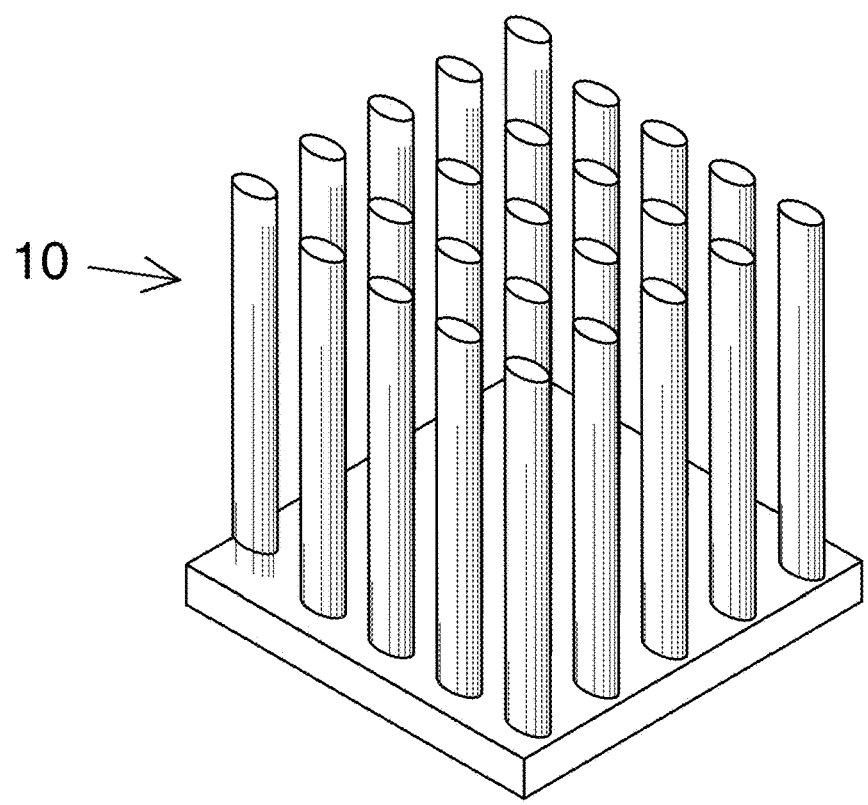
FIG. 1A shows a conventional heat sink design with elliptical pin fins.
Figure 1B:
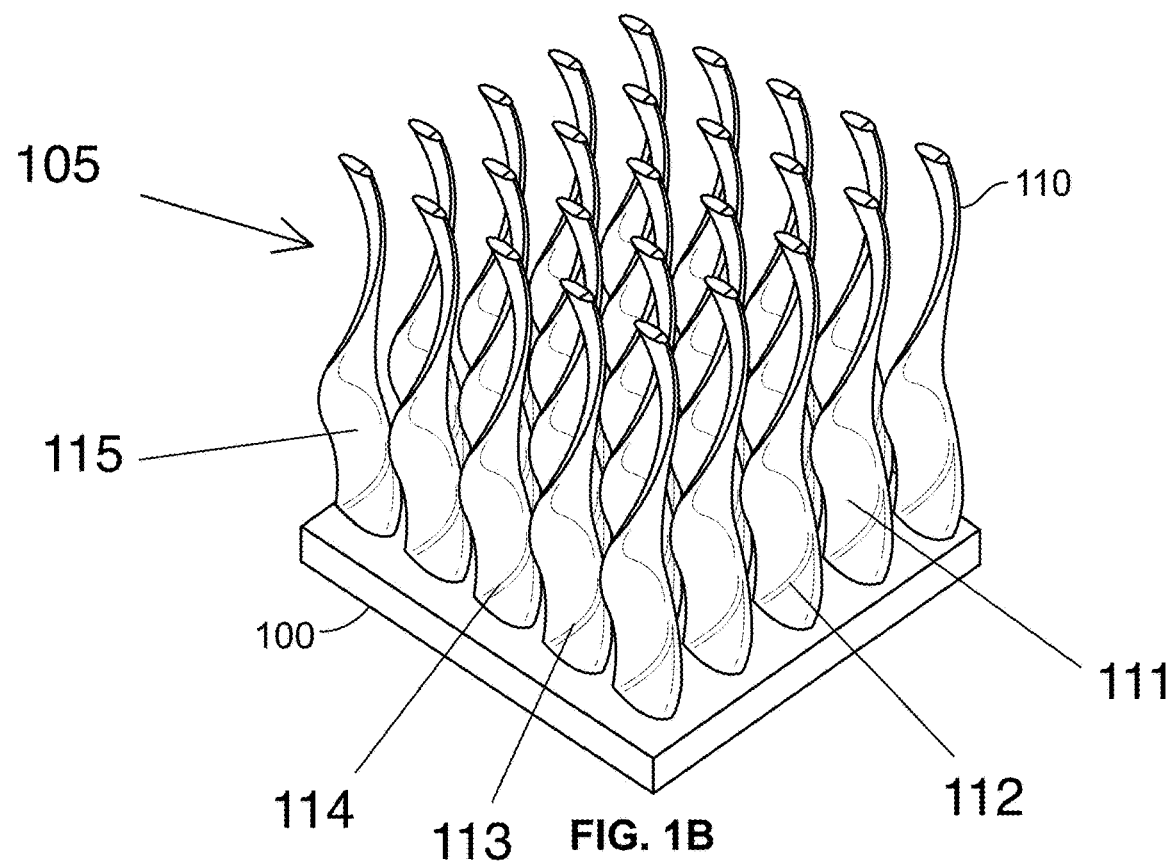
FIG. 1B shows a heat sink design with an array of helical fins for an embodiment of the present invention.

FIG. 1A shows a conventional heat sink design with elliptical pin fins 10. FIG. 1B shows heat sink base 100 with an array 105 comprised of a plurality of helical fins 110-115 for an embodiment of the present invention. As shown in FIGS. 1B-1G, a number of helical fin designs may be used in accordance with the teachings of the present invention.

In a preferred embodiment of the present invention, as shown in FIG. 1C, the formation of helical fin 120 begins with an elliptical base 130. The ellipse may be extruded to a certain height to create elliptical pin fin. Next, the pin may be tapered, with the base of the pin remaining at the original dimensions and the opposing end being decreased in size. Lastly, the pin is twisted in a helical manner. The base is held still as the top portion of the pin is twisted to create a spiral effect. After one pin has been designed, an array of fins is placed on the base of the heat sink in a grid fashion such as fins 110-115. The shape of each fin may vary depending on the type of flow desired and the amount of pressure drop to account for as discussed below for other embodiments of the present invention.

FIG. 1D shows another helical fin 140 that may be used with an embodiment of the present invention. In this design, middle section 142 is larger in diameter than terminal end 144 and pin base 146. As is also shown, as a result of tapering the fin while twisting elongated section 145, pin base 146 is larger in cross-section than end 144. In addition, middle section 142 has a diameter larger than either terminal end 144 or pin base 146 as a result of twisting elongated section 145.

FIG. 1E shows yet another helical fin 150 that may be used with an embodiment of the present invention. In this design, middle section 152 may be smaller in diameter than terminal end 154 and pin base 156. As is also shown, as a result of slightly tapering the fin while twisting elongated section 155, pin base 156 is larger in cross-section than terminal end 154. In addition, middle section 152 has a diameter smaller than either terminal end 154 or pin base 156.

FIG. 1F shows a helical fin 160 that may be used with an embodiment of the present invention. In this design, middle section 162 is larger in diameter than terminal end 164 and pin base 166. Ends 164 and 166 are elliptical in cross-section or shape.

As is also shown, as a result of tapering the fin while twisting elongated section 165, pin base 166 is larger in cross-section than terminal end 164. In addition, middle section 162 has a diameter larger than either terminal end 164 or pin base 166 as a result of twisting elongated section 165.

FIG. 1G shows helical fin 170 that may be used with an embodiment of the present invention. In this design, middle section 172 may be smaller in diameter than terminal end 174 and pin base 176. As is also shown, as a result of slightly tapering the fin while twisting elongated section 175, pin base 176 is larger in cross-section than terminal end 174. In addition, middle section 172 has a diameter smaller than either terminal end 174 or pin base 176.

Figure 1H:
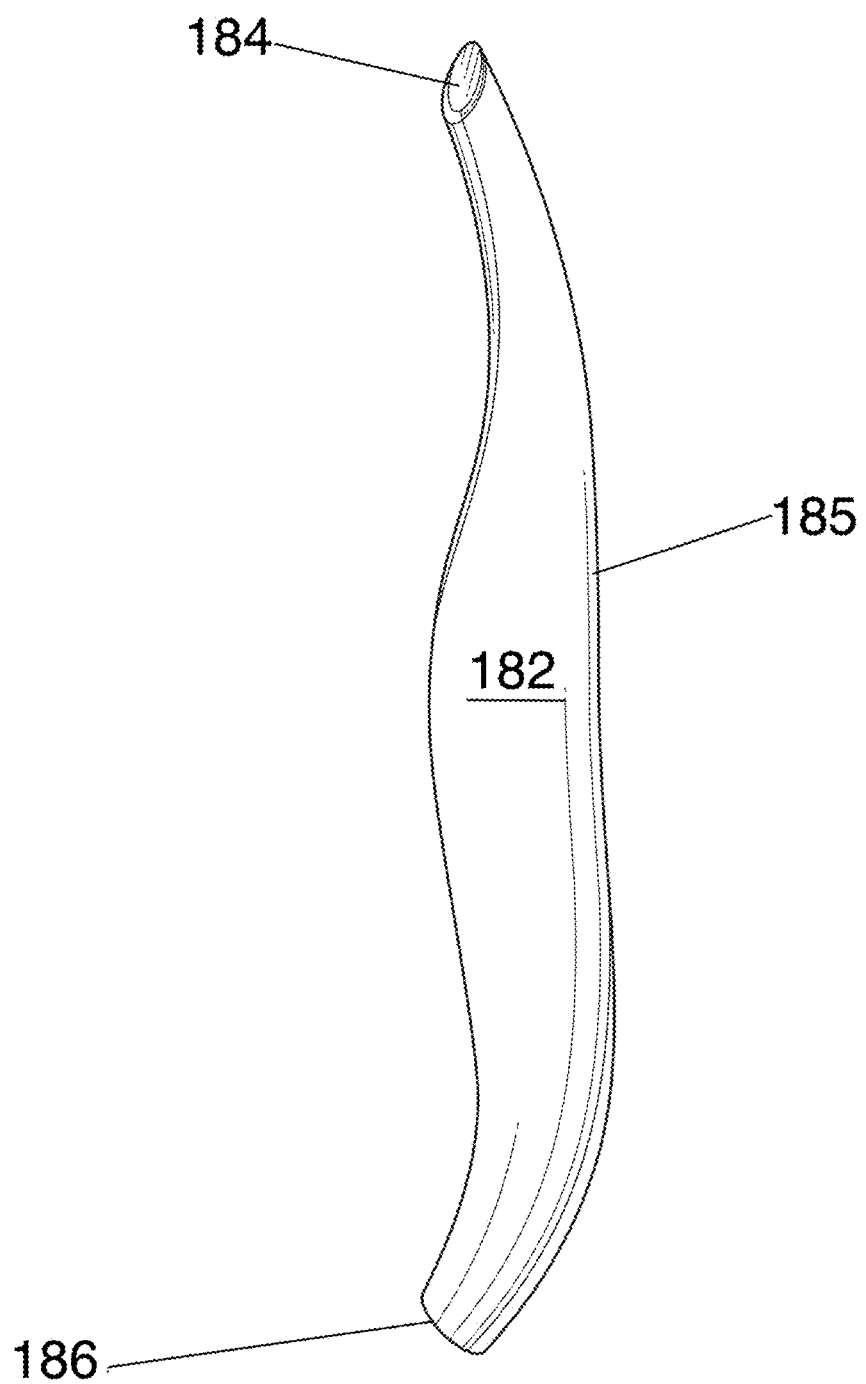
FIG. 1H shows a sixth helical fin that may be used with an embodiment of the present invention.

FIG. 1H shows a helical fin 182 that may be used with an embodiment of the present invention. In this design, middle section 182 is larger in diameter than terminal end 184 and pin base 186. As is also shown, as a result of tapering the fin while twisting elongated section 185, pin base 186 is larger in cross-section than terminal end 184. In addition, middle section 182 has a diameter larger than either terminal end 184 or pin base 186 as a result of twisting elongated section 185.

Figure 2A:
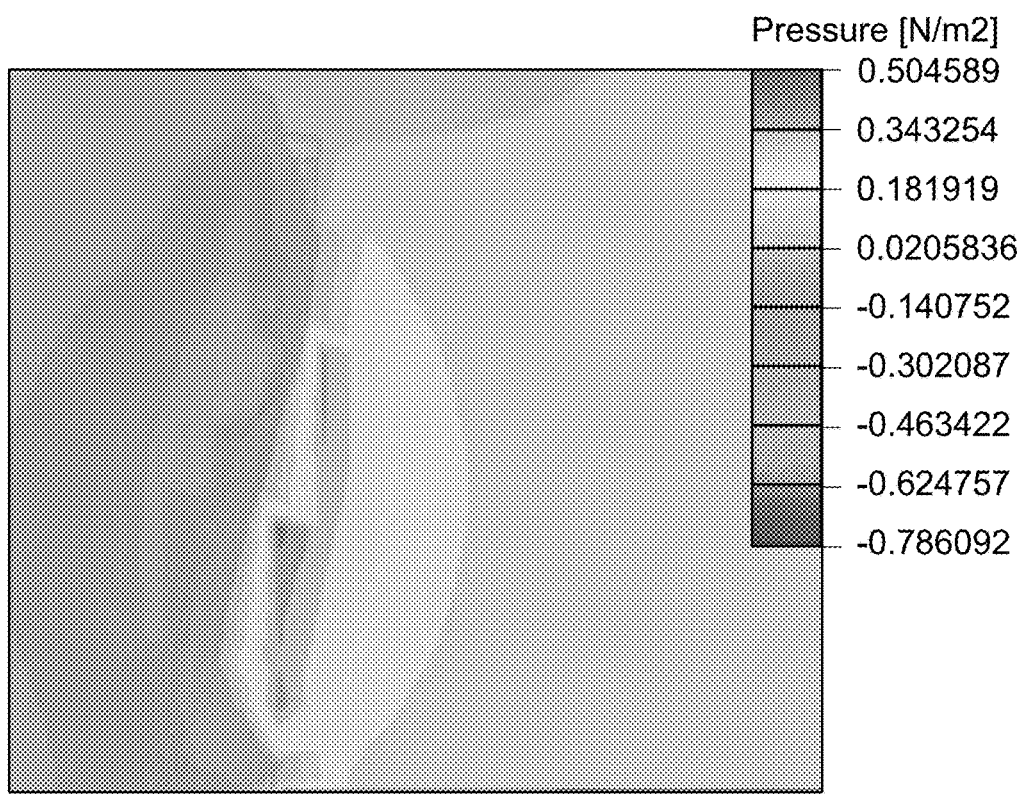
FIG. 2A illustrates that the pressure field on either side of a fin is asymmetric for an embodiment of the present invention.
Figure 2B:
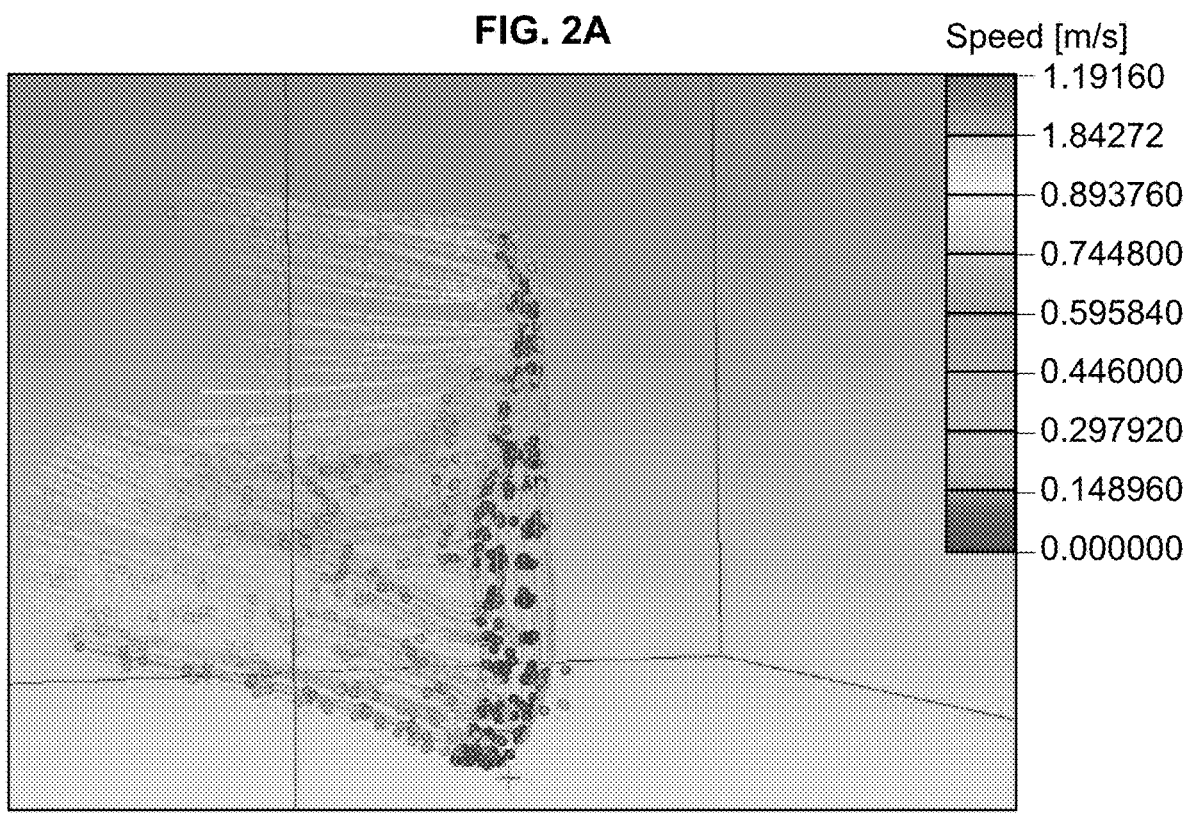
FIG. 2B illustrates that there is an increase in mixing flow behavior for an embodiment of the present invention.

The helical fin heat sink was tested with the ANSYS Icepak flow simulation software. The material of the model was designated to be stock aluminum. The first step was to test how the helical shape affected the fluid flowing around it. The shape was configured to create an increase in mixing while keeping the pressure drop at a reasonable level. After initial testing, the shape did just that. As seen in FIG. 2A, the pressure field on either side of the fin is asymmetric. This means that the fluid will curve around the fin and create more heat transfer because the fluid is in contact with the fin longer. Additionally, as seen in FIG. 2B, there is an increase in mixing flow behavior after the model.

Figure 3:
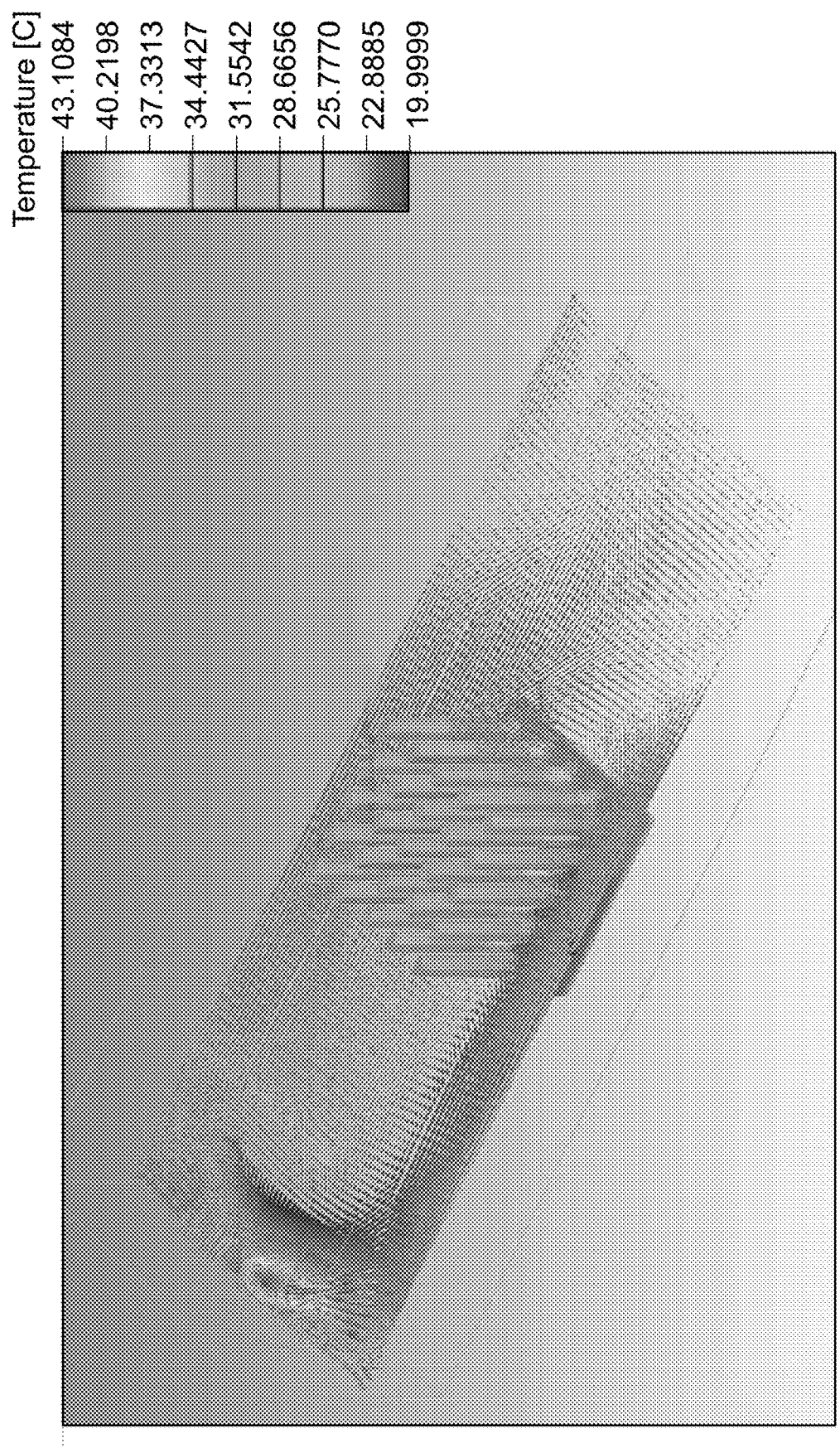
FIG. 3 shows the results of the baseline test.

The conditions for testing the assembled heat sink model included introducing a heat source on the bottom flat plate of the heat sink. Next, a fan producing a certain cubic feet per minute was placed in the testing environment to flow over the model. The helical fin design was tested along with the stock elliptical fin design so that a baseline performance could be measured. FIG. 3 shows the results of the baseline test. As seen, the maximum temperature in the sink is about 43 degrees Celsius.

Figure 4:
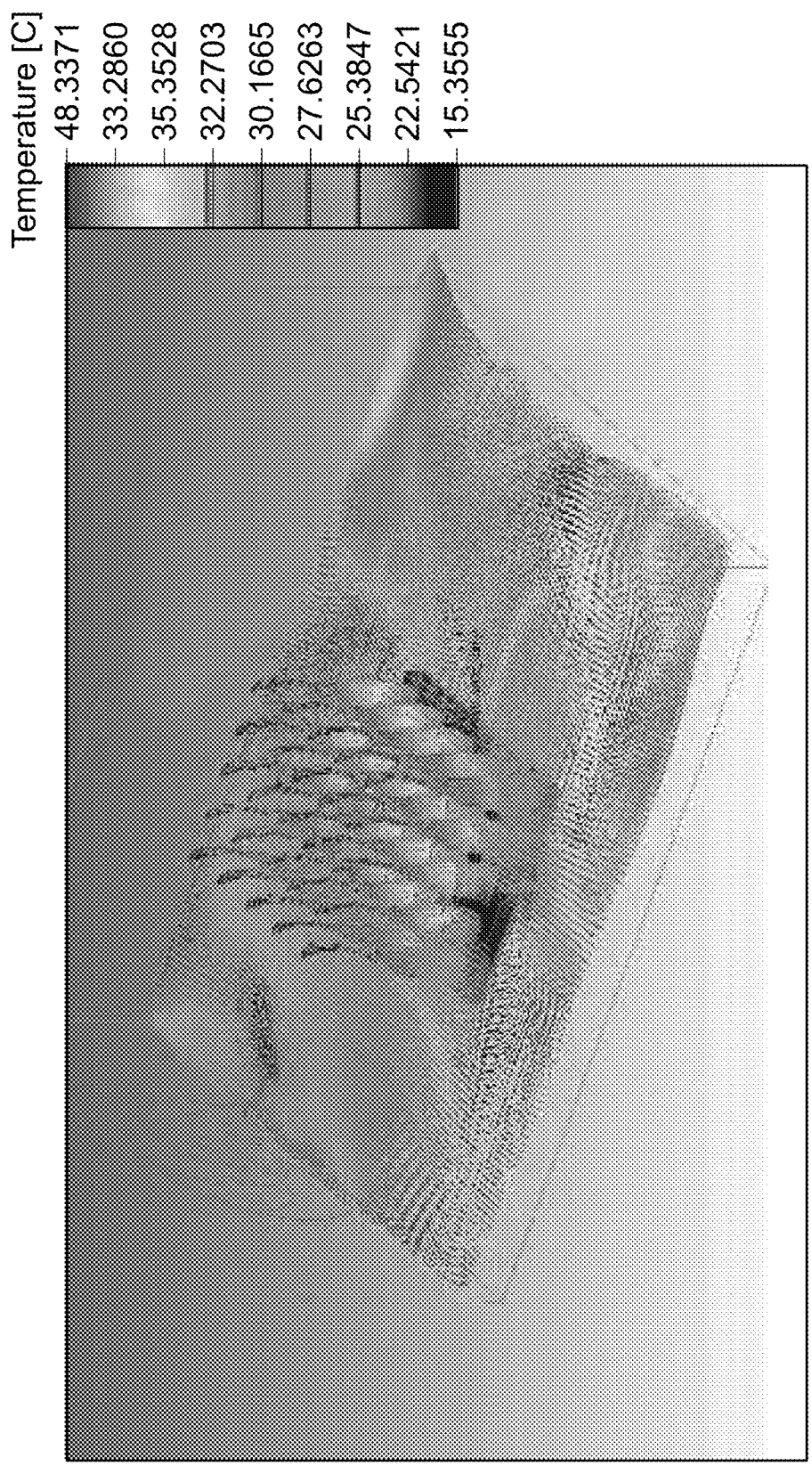
FIG. 4 shows the results of the helical fin heat sink for an embodiment of the present invention.

FIG. 4 shows the results of the helical fin heat sink. The maximum temperature for this test was about 40 degrees Celsius. This in effect shows the efficiency of the mixing and flow characteristics with respect to the amount of heat transfer taking place in the heat sink.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above-described embodiments, methods, and examples, but by all embodiments and methods within the scope and spirit of the disclosure.

What is claimed is:

1. A heat sink comprising: one or more helical fins;
   said helical fins have a pin base, terminal end and an elongated section connecting said pin base to said terminal end; and
   a portion of said elongated section has a diameter larger than said terminal end and said pin base.

2. The heat sink of claim 1 wherein said one or more helical fins are configured such that fluid curves around the fin to increase heat transfer.

3. The heat sink of claim 2 wherein said one or more helical fins are configured to create vortices to disrupt the flow field.

4. The heat sink of claim 1 wherein at least said one or more helical fins has a pin base, terminal end and an elongated section connecting said pin base to said terminal end.

5. The heat sink of claim 1 wherein said pin base and said terminal end have an elliptical cross-section.

6. The heat sink of claim 5 wherein said elliptical cross-section of said pin base is larger than said elliptical cross-section of said terminal end.

7. The heat sink of claim 6 wherein said elongated section tapers from said pin base to said terminal end.

8. The heat sink of claim 7 wherein said one or more fins are metallic or non-metallic or combinations thereof.

* * * * *